United States Patent
Cheng et al.

(10) Patent No.: US 10,818,776 B2
(45) Date of Patent: Oct. 27, 2020

(54) NANOSHEET TRANSISTOR WITH OPTIMIZED JUNCTION AND CLADDING DETECTIVITY CONTROL

(71) Applicant: International Business Machines Corporation, Armonk, NY (US)

(72) Inventors: Kangguo Cheng, Schenectady, NY (US); Nicolas Loubet, Guilderland, NY (US); Ruilong Xie, Schenectady, NY (US); Tenko Yamashita, Schenectady, NY (US); Chun-Chen Yeh, Clifton Park, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/600,050

(22) Filed: Oct. 11, 2019

(65) Prior Publication Data
US 2020/0044053 A1 Feb. 6, 2020

Related U.S. Application Data

(60) Division of application No. 15/659,400, filed on Jul. 25, 2017, now Pat. No. 10,546,942, and a
(Continued)

(51) Int. Cl.
*H01L 29/66* (2006.01)
*H01L 29/775* (2006.01)
(Continued)

(52) U.S. Cl.
CPC ........ *H01L 29/66545* (2013.01); *B82Y 10/00* (2013.01); *B82Y 40/00* (2013.01);
(Continued)

(58) Field of Classification Search
CPC ..... H01L 29/66545; H01L 2924/13061; H01L 29/0688; H01L 29/0684; H01L 29/068;
(Continued)

(56) References Cited

U.S. PATENT DOCUMENTS

| 8,778,768 B1 * | 7/2014 | Chang ............... H01L 29/42392 257/213 |
| 9,570,609 B2 * | 2/2017 | Obradovic ........ H01L 29/42392 |

(Continued)

OTHER PUBLICATIONS

List of all IBM related dockets. Appendix P. 2019.

*Primary Examiner* — Edward Chin
(74) *Attorney, Agent, or Firm* — Garg Law Firm, PLLC; Rakesh Garg; Joseph Petrokaitis

(57) ABSTRACT

A substrate structure having a set of nanosheet layers and a set of sacrificial layers stacked upon a substrate is received and a dummy gate is formed upon the nanosheet layers and the sacrificial layers. A portion of a subset of the set of sacrificial layers and a subset of the set of nanosheet layers is etched. A portion of a subset of the subset of sacrificial layers is etched to create divots within the sacrificial layers. A divot fill layer is deposited. The divot fill layer is etched to form an inner spacer between the nanosheet layers. A source/drain region is formed adjacent to the nanosheet layers and the divots. A remaining portion of the subset of the sacrificial layers is removed. The subset of the nanosheet layers is etched to a desired channel thickness producing faceted surfaces between the subset of nanosheet layers and the inner spacer.

12 Claims, 17 Drawing Sheets

Related U.S. Application Data continuation of application No. 15/980,833, filed on May 16, 2018, now Pat. No. 10,566,443.

(51) Int. Cl.
| | |
|---|---|
| *H01L 21/84* | (2006.01) |
| *H01L 29/417* | (2006.01) |
| *B82Y 40/00* | (2011.01) |
| *H01L 29/786* | (2006.01) |
| *H01L 29/06* | (2006.01) |
| *H01L 27/12* | (2006.01) |
| *H01L 29/423* | (2006.01) |
| *B82Y 10/00* | (2011.01) |

(52) U.S. Cl.
CPC .......... *H01L 21/84* (2013.01); *H01L 27/1203* (2013.01); *H01L 29/0653* (2013.01); *H01L 29/0673* (2013.01); *H01L 29/41725* (2013.01); *H01L 29/42392* (2013.01); *H01L 29/66439* (2013.01); *H01L 29/66553* (2013.01); *H01L 29/775* (2013.01); *H01L 29/78696* (2013.01); *H01L 29/0665* (2013.01)

(58) Field of Classification Search
CPC ............ H01L 29/0676; H01L 29/0673; H01L 29/0669; H01J 2329/0455; H01J 2201/30434

See application file for complete search history.

(56) References Cited

U.S. PATENT DOCUMENTS

| | | | |
|---|---|---|---|
| 9,653,289 B1* | 5/2017 | Balakrishnan | H01L 27/088 |
| 9,972,720 B2* | 5/2018 | Bae | H01L 29/78609 |
| 10,103,238 B1* | 10/2018 | Zang | H01L 21/311 |
| 2008/0135949 A1* | 6/2008 | Lo | B82Y 10/00 257/401 |
| 2013/0259457 A1* | 10/2013 | Yokouchi | H01L 21/68785 392/416 |

\* cited by examiner

NANOSHEET TRANSISTOR WITH OPTIMIZED JUNCTION AND CLADDING DETECTIVITY CONTROL

TECHNICAL FIELD

The present invention relates generally to a method, system, and computer program product for fabricating nanosheet transistors. More particularly, the present invention relates to a method, system, and computer program product for fabricating nanosheet transistors with optimized junction and cladding defectivity control.

BACKGROUND

An integrated circuit (IC) is an electronic circuit formed using a semiconductor material, such as Silicon, as a substrate and by adding impurities to form solid-state electronic devices, such as transistors, diodes, capacitors, and resistors. Commonly known as a "chip" or a "package", an integrated circuit is generally encased in hard plastic, forming a "package". The components in modern day electronics generally appear to be rectangular black plastic packages with connector pins protruding from the plastic encasement. Often, many such packages are electrically coupled so that the chips therein form an electronic circuit to perform certain functions.

The software tools used for designing ICs produce, manipulate, or otherwise work with the circuit layout and circuit components on very small scales. Some of the components that such a tool may manipulate may only measure tens of nanometer across when formed in Silicon. The designs produced and manipulated using these software tools are complex, often including hundreds of thousands of such components interconnected to form an intended electronic circuitry.

A layout includes shapes that the designer selects and positions to achieve a design objective. The objective is to have the shape—the target shape—appear on the wafer as designed. However, the shapes may not appear exactly as designed when manufactured on the wafer through photolithography. For example, a rectangular shape with sharp corners may appear as a rectangular shape with rounded corners on the wafer.

Once a design layout, also referred to simply as a layout, has been finalized for an IC, the design is converted into a set of masks or reticles. A set of masks or reticles is one or more masks or reticles. During manufacture, a semiconductor wafer is exposed to light or radiation through a mask to form microscopic components of the IC. This process is known as photolithography.

A manufacturing mask is a mask usable for successfully manufacturing or printing the contents of the mask onto wafer. During the photolithographic printing process, radiation is focused through the mask and at certain desired intensity of the radiation. This intensity of the radiation is commonly referred to as "dose". The focus and the dosing of the radiation has to be precisely controlled to achieve the desired shape and electrical characteristics on the wafer.

The software tools used for designing ICs produce, manipulate, or otherwise work with the circuit layout and circuit components on very small scales. Some of the components that such a tool may manipulate may only measure tens of nanometer across when formed in Silicon. The designs produced and manipulated using these software tools are complex, often including hundreds of thousands of such components interconnected to form an intended electronic circuitry.

Many semiconductor devices are planar, i.e., where the semiconductor structures are fabricated on one plane. A non-planar device is a three-dimensional (3D) device where some of the structures are formed above or below a given plane of fabrication.

A Field Effect Transistor (FET) is a semiconductor device that has controls the electrical conductivity between a source of electric current (source) and a destination of the electrical current (drain). The FET uses a semiconductor structure called a "gate" to create an electric field, which controls the shape and consequently the electrical conductivity of a channel between the source and the drain. The channel is a charge carrier pathway constructed using a semiconductor material.

Nanosheet transistor devices are becoming increasingly pursed as a viable semiconductor device option, especially for transistors at smaller scales, e.g., at five nanometer (nm) and smaller scales. A nanosheet FET transistor typically includes a substrate, an isolation layer, a number of vertically stacked nanosheets forming a channel, and a gate. A nanosheet is formed of a thin layer of semiconductor channel material having a vertical thickness that is less than a width of the material.

SUMMARY

The illustrative embodiments provide a method, system, and computer program product. An embodiment of a method of fabricating a nanosheet transistor includes receiving a substrate structure having a set of nanosheet layers and a set of sacrificial layers stacked upon a substrate. The embodiment further includes forming a dummy gate upon the stacked set of nanosheet layers and the set of sacrificial layers, etching a portion of a subset of the set of sacrificial layers and a subset of the set of nanosheet layers, and etching a portion of a subset of the subset of sacrificial layers to create divots within the subset of the subset of sacrificial layers. The embodiment further includes depositing a divot fill layer upon the subset of the set of sacrificial layers and the subset of the set of nanosheet layers to fill the divots, and etching the divot fill layer to form an inner spacer between the subset of the set of nanosheet layers. The embodiment further includes forming a source/drain (S/D) region adjacent to the subset of nanosheet layers and the divots, and removing a remaining portion of the subset of the set of sacrificial layers. The embodiment further includes etching the subset of the set of nanosheet layers to a desired channel thickness, thereby producing faceted surfaces between the subset of the set of nanosheet layers and the inner spacer.

An embodiment further includes forming a cladding layer upon at least one surface of the subset of the set of nanosheet layers. In an embodiment, the faceted surfaces are (1 1 1) plane silicon crystal lattice oriented surfaces in which a growth rate of cladding material is less than that of a (1 0 0) plane silicon surface of the at least one surface of the subset of the set of nanosheet layers.

An embodiment further includes forming a hard mask over the dummy gate. An embodiment further includes removing a portion of the hard mask to expose an upper surface of the dummy gate, and removing the dummy gate. In another embodiment, the subset of the set of sacrificial layers and the subset of the set of nanosheet layers are etched to be substantially aligned to one or more sides of the hard mask.

In an embodiment, the set of nanosheet layers and the set of sacrificial layers are stacked upon an isolation layer, and the isolation layer is disposed upon the substrate. An embodiment further includes depositing a gate material. An embodiment further includes forming a self-aligned contact (SAC) cap upon the gate material. An embodiment further includes forming metal contacts to the S/D region and the gate material.

In an embodiment, the set of nanosheet layers are formed of silicon (Si) material. In an embodiment, the set of sacrificial layers are formed of a silicon-germanium (SiGe) material. In an embodiment, the divot fill layer is formed of a silicon nitride (SiN) material.

An embodiment includes a computer usable program product. The computer usable program product includes one or more computer-readable storage devices, and program instructions stored on at least one of the one or more storage devices.

An embodiment includes a computer system. The computer system includes one or more processors, one or more computer-readable memories, and one or more computer-readable storage devices, and program instructions stored on at least one of the one or more storage devices for execution by at least one of the one or more processors via at least one of the one or more memories.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of the illustrative embodiments when read in conjunction with the accompanying drawings, wherein:

DETAILED DESCRIPTION

Figure 1:
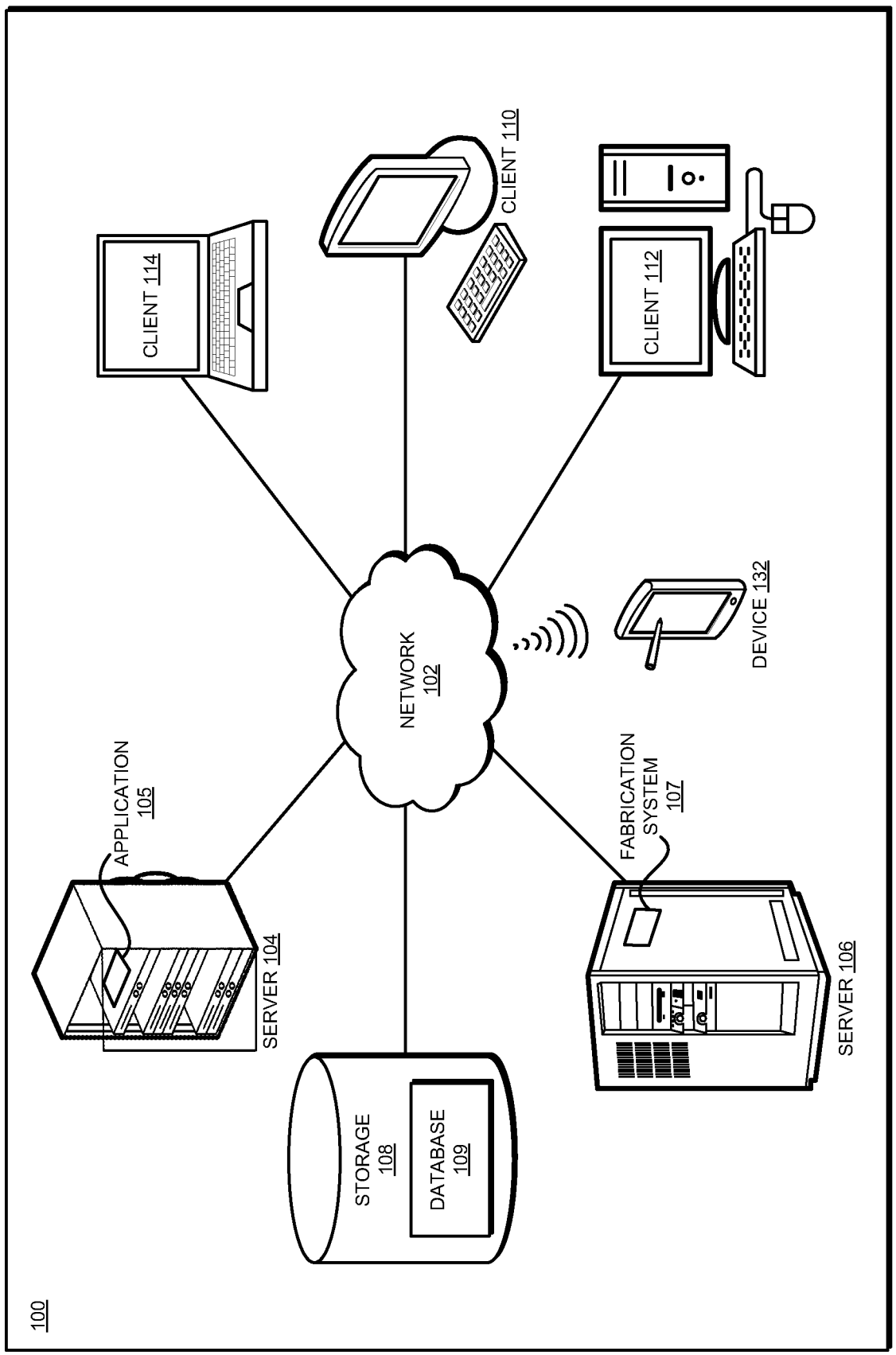
FIG. 1 depicts a block diagram of a network of data processing systems in which illustrative embodiments may be implemented.

The illustrative embodiments relate to a method, system, and computer program product for fabricating nanosheet transistors with optimized junction and cladding defectivity control. The illustrative embodiments recognize that the present methods and techniques for fabricating nanosheet transistors suffer from several problems. For example, forming inner space spacers, particularly those requiring tight design ground rules, is challenging. In another example, growing high quality source/drain (S/D) epitaxy to reduce S/D resistance is difficult. In another example, mitigating the effect of potential defects of silicon-germanium (SiGe) epitaxy on a silicon (Si) nanosheet channel is problematic. Certain embodiments used to describe the invention generally address and solve one or more of the above-described problems and other problems related to fabricating nanosheet transistors.

In one or more embodiments, a nanosheet that is thicker than the final nanosheet channel width is used during fabrication. In particular embodiments, the wider nanosheet improves source/drain epitaxy quality and reduces source/drain resistance. In one or more embodiments, the thick nanosheet is then thinned, such as by hydrochloric acid (HCl) vapor, to create faceted surfaces after a poly open CMP (POC) process. In particular embodiments, the faceted surfaces are (1 1 1) plane silicon crystal lattice oriented surfaces in which the rate of SiGe epitaxy deposition is much less than that of a (1 0 0) plane silicon surface as further described herein. In one or more embodiments, thinning the nanosheet in the PFET region moves the silicon (Si) nanosheet channel away from the dielectric spacers such that when cladding SiGe is grown. In particular embodiments, when the SiGe is grown away from dielectric spacers, potential epitaxy defects are kept away from the channel.

An embodiment can be implemented as a software application. The application implementing an embodiment can be configured as a modification of an existing fabrication system, as a separate application that operates in conjunction with an existing fabrication system, a standalone application, or some combination thereof. For example, the application causes the fabrication system to perform the steps described herein, to fabricate nanosheet transistors.

For the clarity of the description, and without implying any limitation thereto, the illustrative embodiments are described using an n-type FET (NFET) nanosheet transistor and a p-type FET (PFET) nanosheet transistor disposed on a substrate. An embodiment can be implemented with different types and/or numbers of nanosheet transistors, a number of gates, and/or a different number of substrates within the scope of the illustrative embodiments.

Furthermore, a simplified diagram of the example NFETs and PFETs are used in the figures and the illustrative embodiments. In an actual fabrication of a NFET and PFET, additional structures that are not shown or described herein may be present without departing the scope of the illustrative embodiments. Similarly, within the scope of the illustrative embodiments, a shown or described structure in the example NFETs and PFETs may be fabricated differently to yield a similar operation or result as described herein.

Differently shaded portions in the two-dimensional drawing of the example NFETs and PFETs are intended to represent different structures in the example NFETs and PFETs, as described herein. The different structures may be fabricated using suitable materials that are known to those of ordinary skill in the art.

A specific shape or dimension of a shape depicted herein is not intended to be limiting on the illustrative embodiments. The shapes and dimensions are chosen only for the clarity of the drawings and the description and may have been exaggerated, minimized, or otherwise changed from actual shapes and dimensions that might be used in actually fabricating NFETs and PFETs according to the illustrative embodiments.

Furthermore, the illustrative embodiments are described with respect to NFETs and PFETs only as an example. The steps described by the various illustrative embodiments can be adapted for fabricating other planar and non-planar devices employing nanosheets in a similar manner, and such adaptations are contemplated within the scope of the illustrative embodiments.

An embodiment when implemented in an application causes a fabrication process to performs certain steps as described herein. The steps of the fabrication process are depicted in the several figures. Not all steps may be necessary in a particular fabrication process. Some fabrication processes may implement the steps in different order, combine certain steps, remove or replace certain steps, or perform some combination of these and other manipulations of steps, without departing the scope of the illustrative embodiments.

A method of an embodiment described herein, when implemented to execute on a device or data processing system, comprises substantial advancement of the functionality of that device or data processing system in fabricating nanosheet transistor devices. An embodiment provides a method for fabricating nanosheet transistors with optimized junction and cladding defectivity control.

The illustrative embodiments are described with respect to certain types of devices, contacts, layers, planes, structures, materials, dimensions, numerosity, data processing systems, environments, components, and applications only as examples. Any specific manifestations of these and other similar artifacts are not intended to be limiting to the invention. Any suitable manifestation of these and other similar artifacts can be selected within the scope of the illustrative embodiments.

Furthermore, the illustrative embodiments may be implemented with respect to any type of data, data source, or access to a data source over a data network. Any type of data storage device may provide the data to an embodiment of the invention, either locally at a data processing system or over a data network, within the scope of the invention. Where an embodiment is described using a mobile device, any type of data storage device suitable for use with the mobile device may provide the data to such embodiment, either locally at the mobile device or over a data network, within the scope of the illustrative embodiments.

The illustrative embodiments are described using specific code, designs, architectures, protocols, layouts, schematics, and tools only as examples and are not limiting to the illustrative embodiments. Furthermore, the illustrative embodiments are described in some instances using particular software, tools, and data processing environments only as an example for the clarity of the description. The illustrative embodiments may be used in conjunction with other comparable or similarly purposed structures, systems, applications, or architectures. For example, other comparable mobile devices, structures, systems, applications, or architectures therefor, may be used in conjunction with such embodiment of the invention within the scope of the invention. An illustrative embodiment may be implemented in hardware, software, or a combination thereof.

The examples in this disclosure are used only for the clarity of the description and are not limiting to the illustrative embodiments. Additional data, operations, actions, tasks, activities, and manipulations will be conceivable from this disclosure and the same are contemplated within the scope of the illustrative embodiments.

Any advantages listed herein are only examples and are not intended to be limiting to the illustrative embodiments. Additional or different advantages may be realized by specific illustrative embodiments. Furthermore, a particular illustrative embodiment may have some, all, or none of the advantages listed above.

Figure 2:
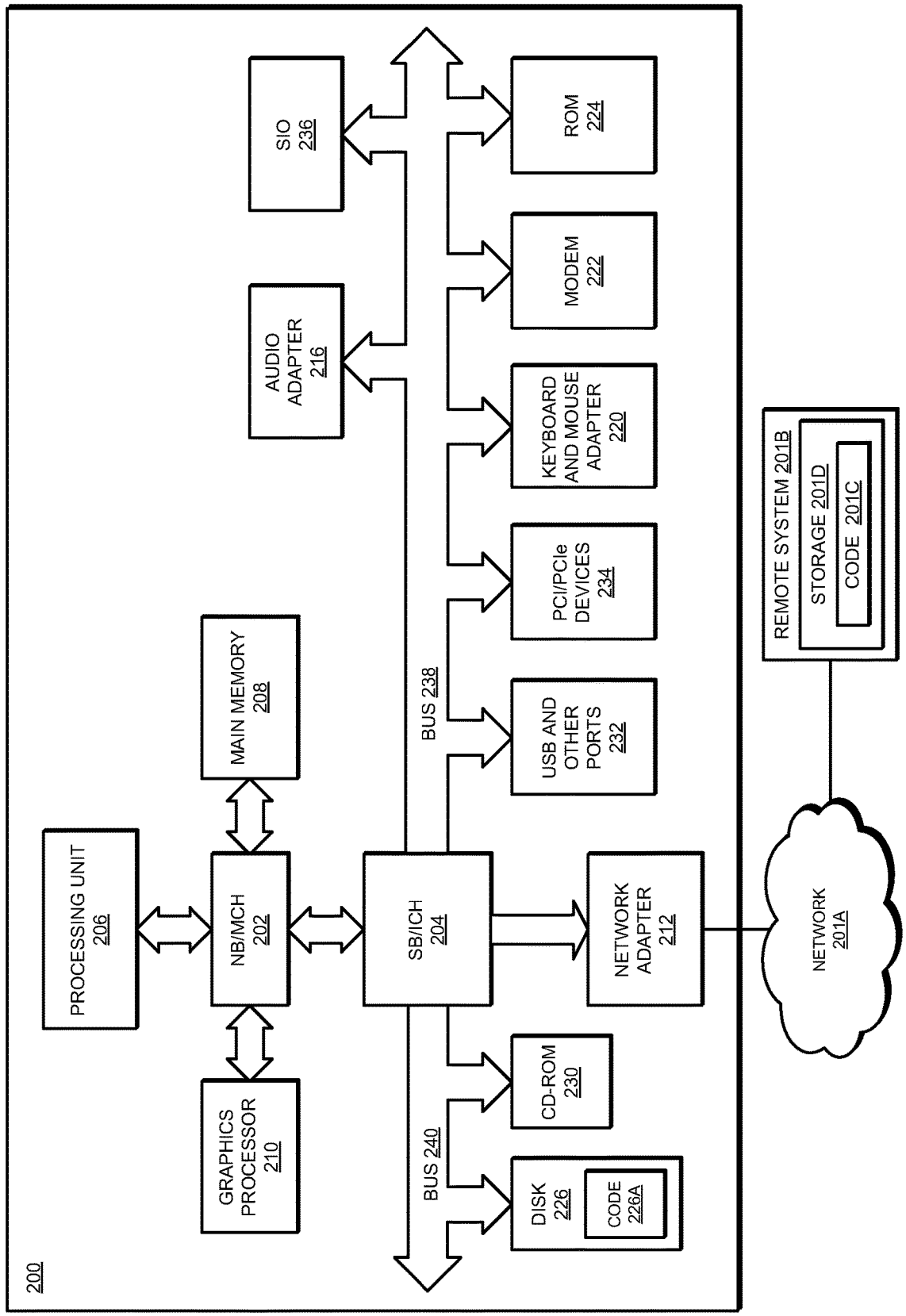
FIG. 2 depicts a block diagram of a data processing system in which illustrative embodiments may be implemented.

With reference to the figures and in particular with reference to FIGS. 1 and 2, these figures are example diagrams of data processing environments in which illustrative embodiments may be implemented. FIGS. 1 and 2 are only examples and are not intended to assert or imply any limitation with regard to the environments in which different embodiments may be implemented. A particular implementation may make many modifications to the depicted environments based on the following description.

FIG. 1 depicts a block diagram of a network of data processing systems in which illustrative embodiments may be implemented. Data processing environment 100 is a network of computers in which the illustrative embodiments may be implemented. Data processing environment 100 includes network 102. Network 102 is the medium used to provide communications links between various devices and computers connected together within data processing environment 100. Network 102 may include connections, such as wire, wireless communication links, or fiber optic cables.

Clients or servers are only example roles of certain data processing systems connected to network 102 and are not intended to exclude other configurations or roles for these data processing systems. Server 104 and server 106 couple to network 102 along with storage unit 108. Software applications may execute on any computer in data processing environment 100. Clients 110, 112, and 114 are also coupled to network 102. A data processing system, such as server 104 or 106, or client 110, 112, or 114 may contain data and may have software applications or software tools executing thereon.

Only as an example, and without implying any limitation to such architecture, FIG. 1 depicts certain components that are usable in an example implementation of an embodiment. For example, servers 104 and 106, and clients 110, 112, 114, are depicted as servers and clients only as example and not to imply a limitation to a client-server architecture. As another example, an embodiment can be distributed across several data processing systems and a data network as shown, whereas another embodiment can be implemented on a single data processing system within the scope of the illustrative embodiments. Data processing systems 104, 106, 110, 112, and 114 also represent example nodes in a cluster, partitions, and other configurations suitable for implementing an embodiment.

Device 132 is an example of a device described herein. For example, device 132 can take the form of a smartphone, a tablet computer, a laptop computer, client 110 in a stationary or a portable form, a wearable computing device, or any other suitable device. Any software application described as executing in another data processing system in FIG. 1 can be configured to execute in device 132 in a similar manner. Any data or information stored or produced in another data processing system in FIG. 1 can be configured to be stored or produced in device 132 in a similar manner.

Application 105 implements an embodiment described herein. Fabrication system 107 is any suitable system for fabricating a semiconductor device. Application 105 provides instructions to system 107 for fabricating one or more nanosheet transistors in a manner described herein.

Servers 104 and 106, storage unit 108, and clients 110, 112, and 114 may couple to network 102 using wired connections, wireless communication protocols, or other suitable data connectivity. Clients 110, 112, and 114 may be, for example, personal computers or network computers.

In the depicted example, server 104 may provide data, such as boot files, operating system images, and applications to clients 110, 112, and 114. Clients 110, 112, and 114 may be clients to server 104 in this example. Clients 110, 112, 114, or some combination thereof, may include their own data, boot files, operating system images, and applications. Data processing environment 100 may include additional servers, clients, and other devices that are not shown.

In the depicted example, data processing environment 100 may be the Internet. Network 102 may represent a collection of networks and gateways that use the Transmission Control Protocol/Internet Protocol (TCP/IP) and other protocols to communicate with one another. At the heart of the Internet is a backbone of data communication links between major nodes or host computers, including thousands of commercial, governmental, educational, and other computer systems that route data and messages. Of course, data processing environment 100 also may be implemented as a number of different types of networks, such as for example, an intranet, a local area network (LAN), or a wide area network (WAN). FIG. 1 is intended as an example, and not as an architectural limitation for the different illustrative embodiments.

Among other uses, data processing environment 100 may be used for implementing a client-server environment in which the illustrative embodiments may be implemented. A client-server environment enables software applications and data to be distributed across a network such that an application functions by using the interactivity between a client data processing system and a server data processing system. Data processing environment 100 may also employ a service oriented architecture where interoperable software components distributed across a network may be packaged together as coherent business applications.

With reference to FIG. 2, this figure depicts a block diagram of a data processing system in which illustrative embodiments may be implemented. Data processing system 200 is an example of a computer, such as servers 104 and 106, or clients 110, 112, and 114 in FIG. 1, or another type of device in which computer usable program code or instructions implementing the processes may be located for the illustrative embodiments.

Data processing system 200 is also representative of a data processing system or a configuration therein, such as data processing system 132 in FIG. 1 in which computer usable program code or instructions implementing the processes of the illustrative embodiments may be located. Data processing system 200 is described as a computer only as an example, without being limited thereto. Implementations in the form of other devices, such as device 132 in FIG. 1, may modify data processing system 200, such as by adding a touch interface, and even eliminate certain depicted components from data processing system 200 without departing from the general description of the operations and functions of data processing system 200 described herein.

In the depicted example, data processing system 200 employs a hub architecture including North Bridge and memory controller hub (NB/MCH) 202 and South Bridge and input/output (I/O) controller hub (SB/ICH) 204. Processing unit 206, main memory 208, and graphics processor 210 are coupled to North Bridge and memory controller hub (NB/MCH) 202. Processing unit 206 may contain one or more processors and may be implemented using one or more heterogeneous processor systems. Processing unit 206 may be a multi-core processor. Graphics processor 210 may be coupled to NB/MCH 202 through an accelerated graphics port (AGP) in certain implementations.

In the depicted example, local area network (LAN) adapter 212 is coupled to South Bridge and I/O controller hub (SB/ICH) 204. Audio adapter 216, keyboard and mouse adapter 220, modem 222, read only memory (ROM) 224, universal serial bus (USB) and other ports 232, and PCI/PCIe devices 234 are coupled to South Bridge and I/O controller hub 204 through bus 238. Hard disk drive (HDD) or solid-state drive (SSD) 226 and CD-ROM 230 are coupled to South Bridge and I/O controller hub 204 through bus 240. PCI/PCIe devices 234 may include, for example, Ethernet adapters, add-in cards, and PC cards for notebook computers. PCI uses a card bus controller, while PCIe does not. ROM 224 may be, for example, a flash binary input/output system (BIOS). Hard disk drive 226 and CD-ROM 230 may use, for example, an integrated drive electronics (IDE), serial advanced technology attachment (SATA) interface, or variants such as external-SATA (eSATA) and micro-SATA (mSATA). A super I/O (SIO) device 236 may be coupled to South Bridge and I/O controller hub (SB/ICH) 204 through bus 238.

Memories, such as main memory 208, ROM 224, or flash memory (not shown), are some examples of computer usable storage devices. Hard disk drive or solid state drive 226, CD-ROM 230, and other similarly usable devices are some examples of computer usable storage devices including a computer usable storage medium.

An operating system runs on processing unit 206. The operating system coordinates and provides control of various components within data processing system 200 in FIG. 2. The operating system may be a commercially available operating system such as AIX® (AIX is a trademark of International Business Machines Corporation in the United States and other countries), Microsoft® Windows® (Microsoft and Windows are trademarks of Microsoft Corporation in the United States and other countries), Linux® (Linux is a trademark of Linus Torvalds in the United States and other countries), iOS™ (iOS is a trademark of Cisco Systems, Inc. licensed to Apple Inc. in the United States and in other countries), or Android™ (Android is a trademark of Google Inc., in the United States and in other countries). An object oriented programming system, such as the Java™ programming system, may run in conjunction with the operating system and provide calls to the operating system from Java™ programs or applications executing on data processing system 200 (Java and all Java-based trademarks and logos are trademarks or registered trademarks of Oracle Corporation and/or its affiliates).

Instructions for the operating system, the object-oriented programming system, and applications or programs, such as application 105 in FIG. 1, are located on storage devices, such as in the form of code 226A on hard disk drive 226, and may be loaded into at least one of one or more memories, such as main memory 208, for execution by processing unit 206. The processes of the illustrative embodiments may be performed by processing unit 206 using computer implemented instructions, which may be located in a memory, such as, for example, main memory 208, read only memory 224, or in one or more peripheral devices.

Furthermore, in one case, code 226A may be downloaded over network 201A from remote system 201B, where similar code 201C is stored on a storage device 201D. in another case, code 226A may be downloaded over network 201A to remote system 201B, where downloaded code 201C is stored on a storage device 201D.

The hardware in FIGS. 1-2 may vary depending on the implementation. Other internal hardware or peripheral devices, such as flash memory, equivalent non-volatile memory, or optical disk drives and the like, may be used in addition to or in place of the hardware depicted in FIGS. 1-2. In addition, the processes of the illustrative embodiments may be applied to a multiprocessor data processing system.

In some illustrative examples, data processing system 200 may be a personal digital assistant (PDA), which is generally configured with flash memory to provide non-volatile memory for storing operating system files and/or user-generated data. A bus system may comprise one or more buses, such as a system bus, an I/O bus, and a PCI bus. Of course, the bus system may be implemented using any type of communications fabric or architecture that provides for a transfer of data between different components or devices attached to the fabric or architecture.

A communications unit may include one or more devices used to transmit and receive data, such as a modem or a network adapter. A memory may be, for example, main memory 208 or a cache, such as the cache found in North Bridge and memory controller hub 202. A processing unit may include one or more processors or CPUs.

The depicted examples in FIGS. 1-2 and above-described examples are not meant to imply architectural limitations. For example, data processing system 200 also may be a tablet computer, laptop computer, or telephone device in addition to taking the form of a mobile or wearable device.

Where a computer or data processing system is described as a virtual machine, a virtual device, or a virtual component, the virtual machine, virtual device, or the virtual component operates in the manner of data processing system 200 using virtualized manifestation of some or all components depicted in data processing system 200. For example, in a virtual machine, virtual device, or virtual component, processing unit 206 is manifested as a virtualized instance of all or some number of hardware processing units 206 available in a host data processing system, main memory 208 is manifested as a virtualized instance of all or some portion of main memory 208 that may be available in the host data processing system, and disk 226 is manifested as a virtualized instance of all or some portion of disk 226 that may be available in the host data processing system. The host data processing system in such cases is represented by data processing system 200.

With reference to FIGS. 3-16, these figures depict an example process for fabricating nanosheet transistors in accordance with one or more illustrative embodiments. In the particular embodiments illustrated in FIGS. 4-14, a single NFET and a single PFET are fabricated upon a substrate and/or wafer. It should be understood that in other embodiments, any combination of NFETs and PFETs or other combinations of any numbers of nanosheet semiconductor devices, may be fabricated on a substrate in a similar manner.

Figure 3:
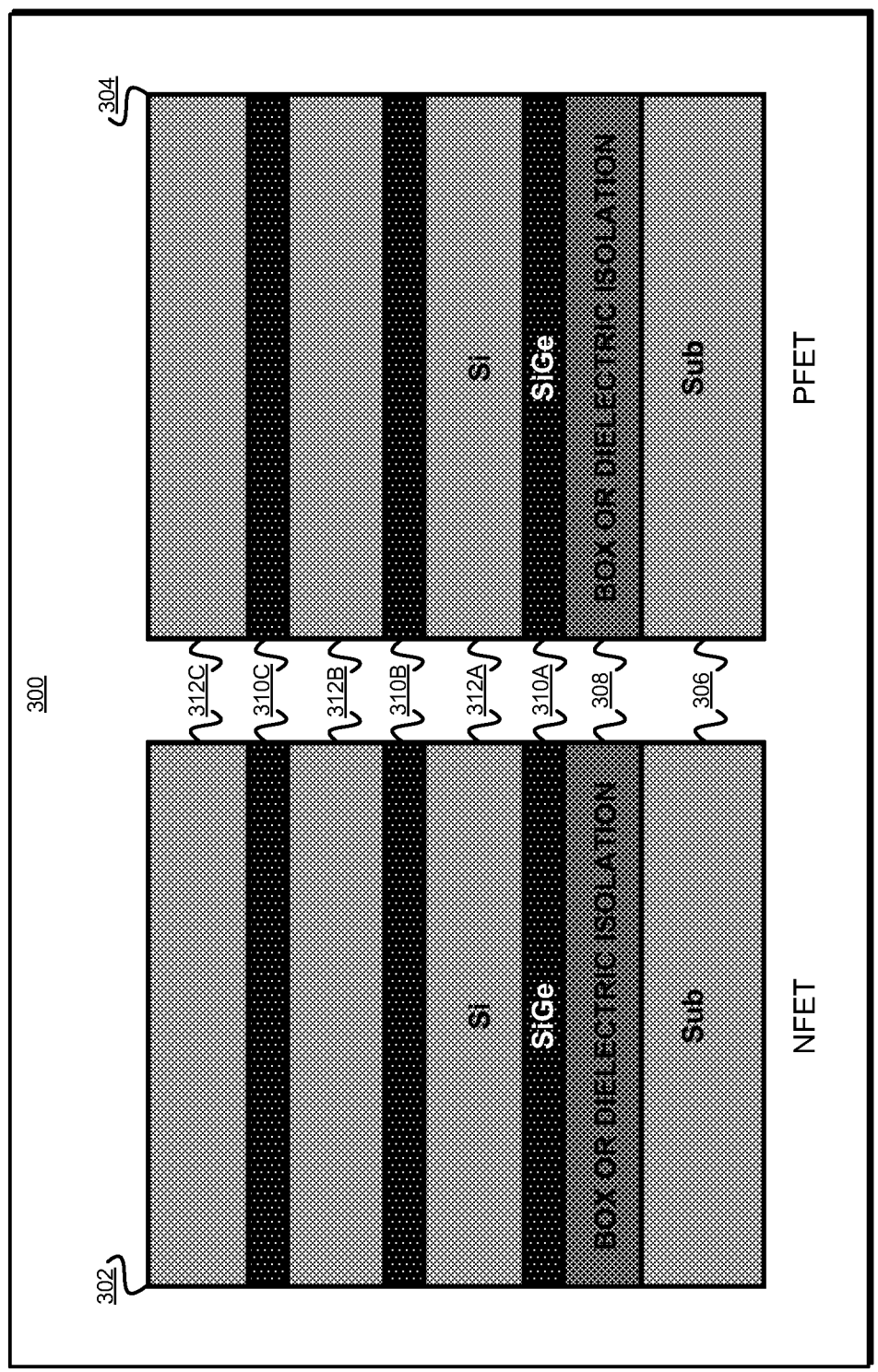
FIG. 3 depicts a portion of a process according to an illustrative embodiment.

With reference to FIG. 3, this figure depicts a portion of a process in which an example substrate structure 300 is received according to an illustrative embodiment. Substrate structure 300 includes an NFET region 302 and a PFET region 304 in accordance with an illustrative embodiment. In one or more embodiments, NFET region 302 and PFET region 304 are each nanosheet transistors. Application 105 in FIG. 1 interacts with fabrication system 107 to produce or manipulate substrate structure 300 as described herein.

Each of NFET region 302 and PFET region 304 includes a substrate layer 306, a dielectric isolation layer 308 formed on substrate layer 306, a first silicon-germanium (SiGe) layer 310a formed on dielectric isolation layer 308, a first silicon (Si) layer 312a formed on first SiGe layer 310a, a second SiGe layer 310b formed on first Si layer 312a, a second Si layer 312b formed on second SiGe layer 310b, a third SiGe layer 310c formed on second Si layer 312b, and a third Si layer 312c formed on third SiGe layer 310c. In the particular embodiment illustrated in FIG. 3, Si layers 312a-312c are thinner than SiGe layers 310a-310c. In one or more embodiments, substrate 310 is formed of a silicon (Si) material. SiGe layers 310a-310c function as sacrificial layers that are substantially removed during subsequent portions of the process. Si layers 312a-312c function as nanosheet layers of the nanosheet transistors. In another embodiment, dielectric isolation layer 308 may be omitted and the SiGe layers 310a-310c and Si layers 312a-312c may be grown directly on substrate layer 306.

Figure 4:
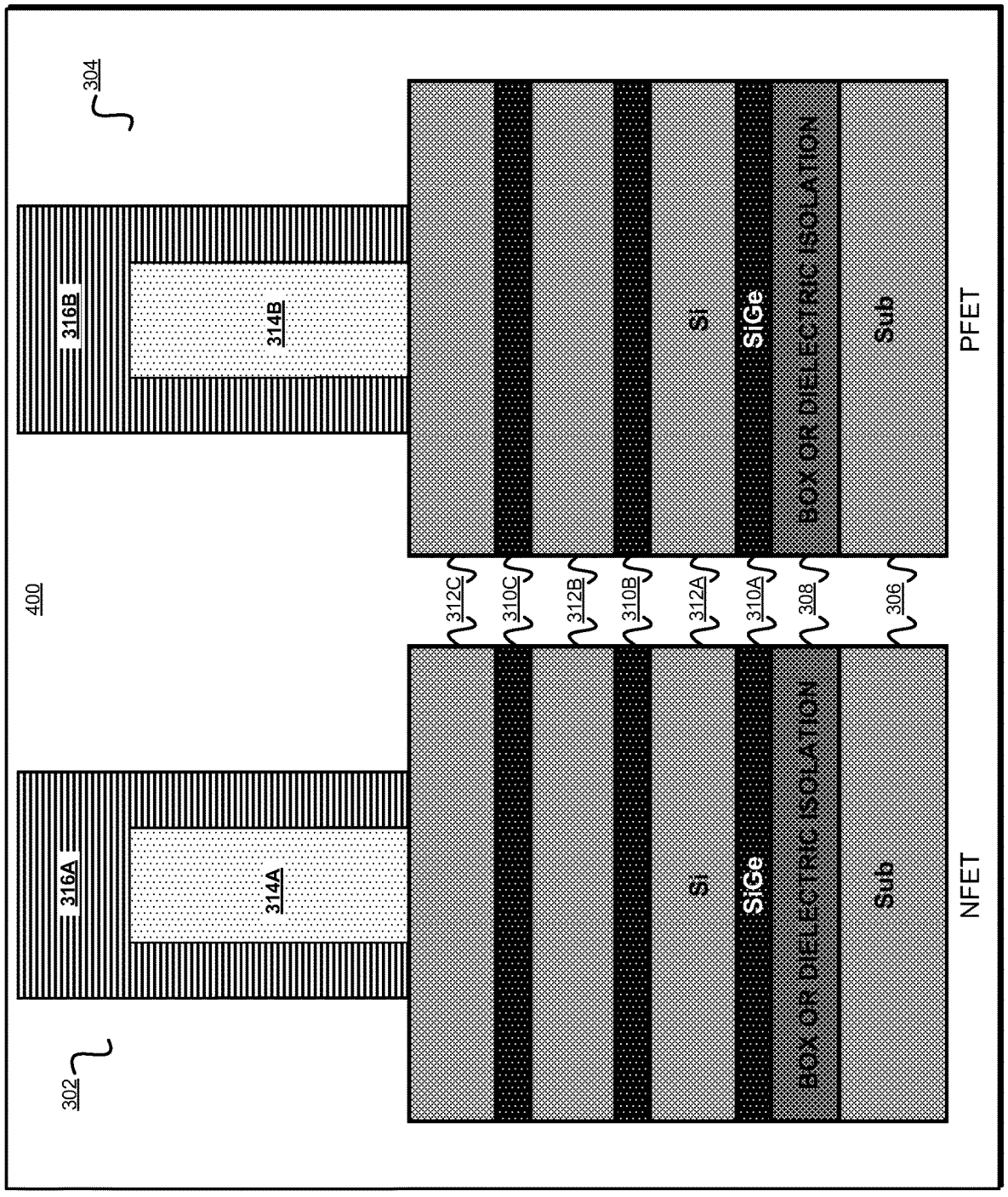
FIG. 4 depicts another portion of a process according to an illustrative embodiment.

With reference to FIG. 4, FIG. 4 depicts another portion of a process in which a structure 400 is formed according to an embodiment. In one or more embodiments, fabrication system 107 forms a first dummy gate 314a upon third Si layer 312c of NFET region 302a and a second dummy gate 314b upon third Si layer 312c of PFET region 304. In the illustrated embodiment, first dummy gate 314a and second dummy gate 314b extend vertically from the upper surface of third Si layer 312c. In one or more embodiments, first dummy gate 314a and second dummy gate 314b function as spacers that are removed and replaced with metal material to form gates during subsequent portions of the fabrication process as further described herein. In particular embodiments, first dummy gate 314a and second dummy gate 314b are formed of a silicon nitride (SiN) material. In one or more embodiments, first dummy gate 314a and second dummy gate 314b are formed by one or more deposition processes.

In one or more embodiments, fabrication system 107 further forms a first hard mask 316a over first dummy gate 314a and a second hard mask 316b over second dummy gate 314b. First hard mask 316a and second hard mask 316b function as a protective layer over first dummy gate 314a and second dummy gate 314b, respectively. In a particular embodiment, first hard mask 316a and second hard mask 316b are formed of a siliconborocarbonitride (SiBCN) material.

Figure 5:
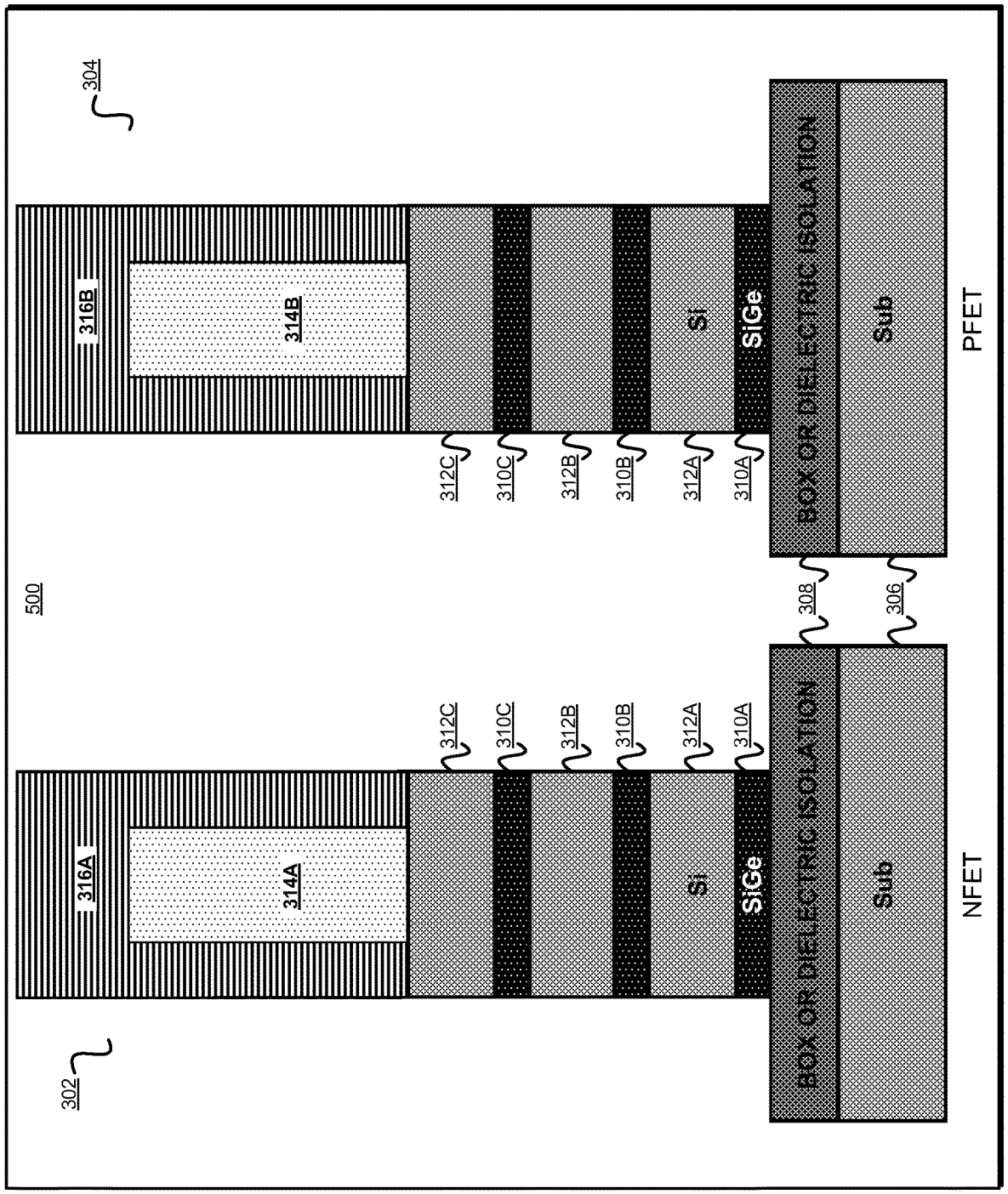
FIG. 5 depicts another portion of a process according to an illustrative embodiment.

With reference to FIG. 5, FIG. 5 depicts another portion of a process in which structure 500 is formed according to an embodiment. In one or more embodiments, fabrication system 107 etches through portions of first SiGe layer 310a, first Si layer 312a, second SiGe layer 310b, second Si layer 312b, third SiGe layer 310c, and third Si layer in NFET region 302 to be substantially aligned to sides of first hard mask 316a to form a recess in NFET region 302. In the embodiment, fabrication system 107 further etches through portions of first SiGe layer 310a, first Si layer 312a, second SiGe layer 310b, second Si layer 312b, third SiGe layer 310c, and third Si layer in PFET region 304 to be substantially aligned to sides of second hard mask 316b to form a recess in PFET region 304.

Figure 6:
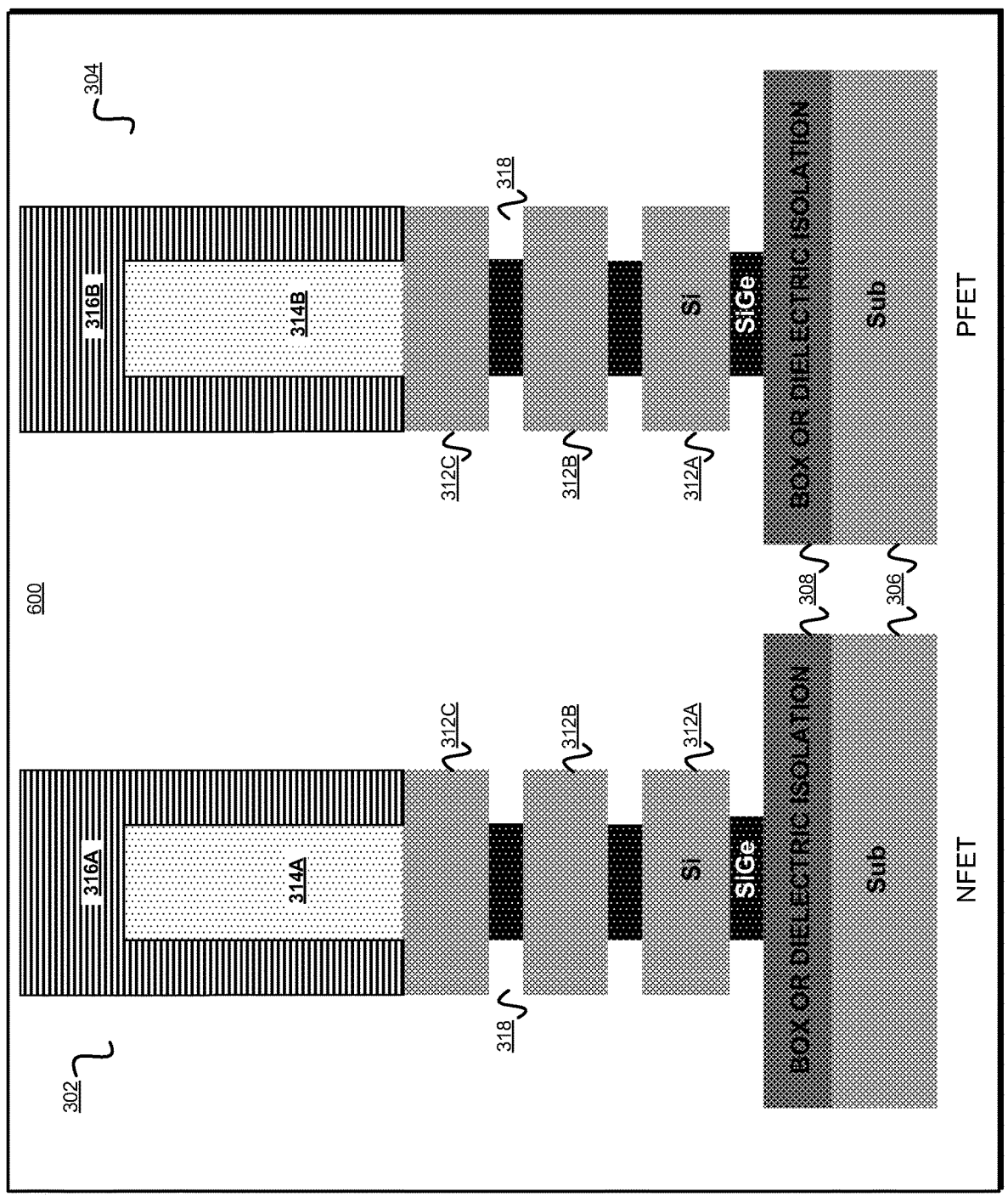
FIG. 6 depicts another portion of a process according to an illustrative embodiment.

With reference to FIG. 6, FIG. 6 depicts another portion of a process in which a structure 600 is formed according to an embodiment. In one or more embodiments, fabrication system 107 selectively laterally etches edges of each of first SiGe layer 310a, second SiGe layer 310b, and third SiGe layer 310c of NFET region 302 and PFET region 304 to create divots (or indentations) 318 within SiGe layers 310a-310c without substantially affecting Si layers 312a-312c. In one or more embodiments, the depth of divots 318 within SiGe layers 310a-310c are substantially aligned with the sides of first dummy gate 314a and second dummy gate 314b, respectively. In particular embodiments, divots 318 are created using a vapor phase (e.g., HCl) or wet etching process.

Figure 7:
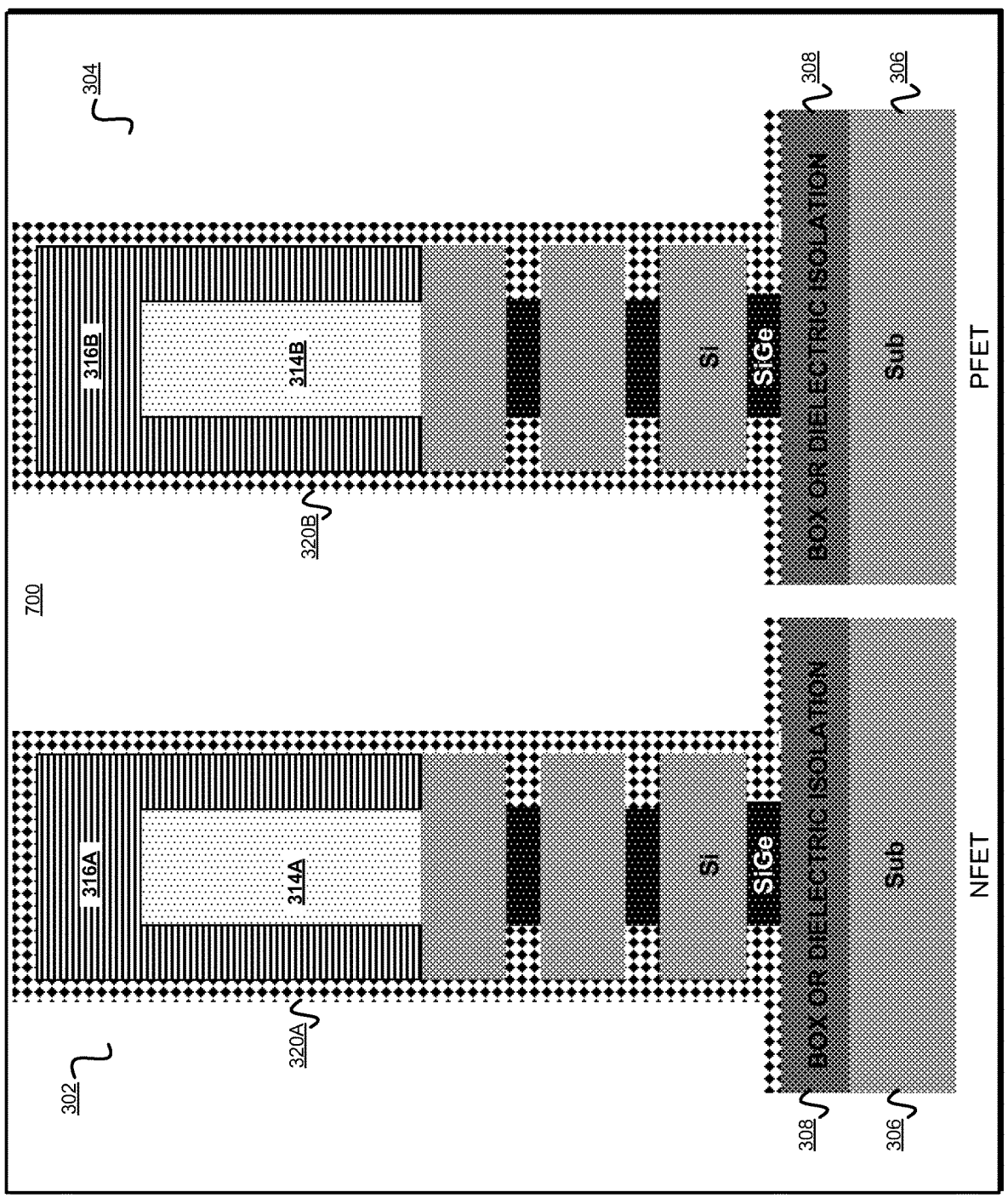
FIG. 7 depicts another portion of a process according to an illustrative embodiment.

With reference to FIG. 7, FIG. 7 depicts another portion of a process in which a structure 700 is formed according to an embodiment. In one or more embodiments, fabrication system 107 deposits a first divot fill layer 320a upon the upper surface of dielectric isolation layer 308, first SiGe layer 310a, first Si layer 312a, second SiGe layer 310b, second Si layer 312b, third SiGe layer 310c, third Si layer 312c, and first hard mask 316a to fill divots 318 of NFET region 302. In the embodiment, fabrication system 107 deposits a second divot fill layer 320b upon the upper surface of dielectric isolation layer 308, first SiGe layer 310a, first Si layer 312a, second SiGe layer 310b, second Si layer 312b, third SiGe layer 310c, third Si layer 312c, and first hard mask 316a to fill divots 318 of PFET region 304. In particular embodiments, first divot fill layer 320a and second divot fill layer 320b may be of a relatively thin layer thickness. In one or more embodiments, the thin layer thickness provides a benefit of allowing gate pitch to be scaled downwardly to accommodate decreasing clearance while still provided for divot filling. In particular embodiments, first divot fill layer 320a and second divot fill layer 320b are formed of a SiN material.

Figure 8:
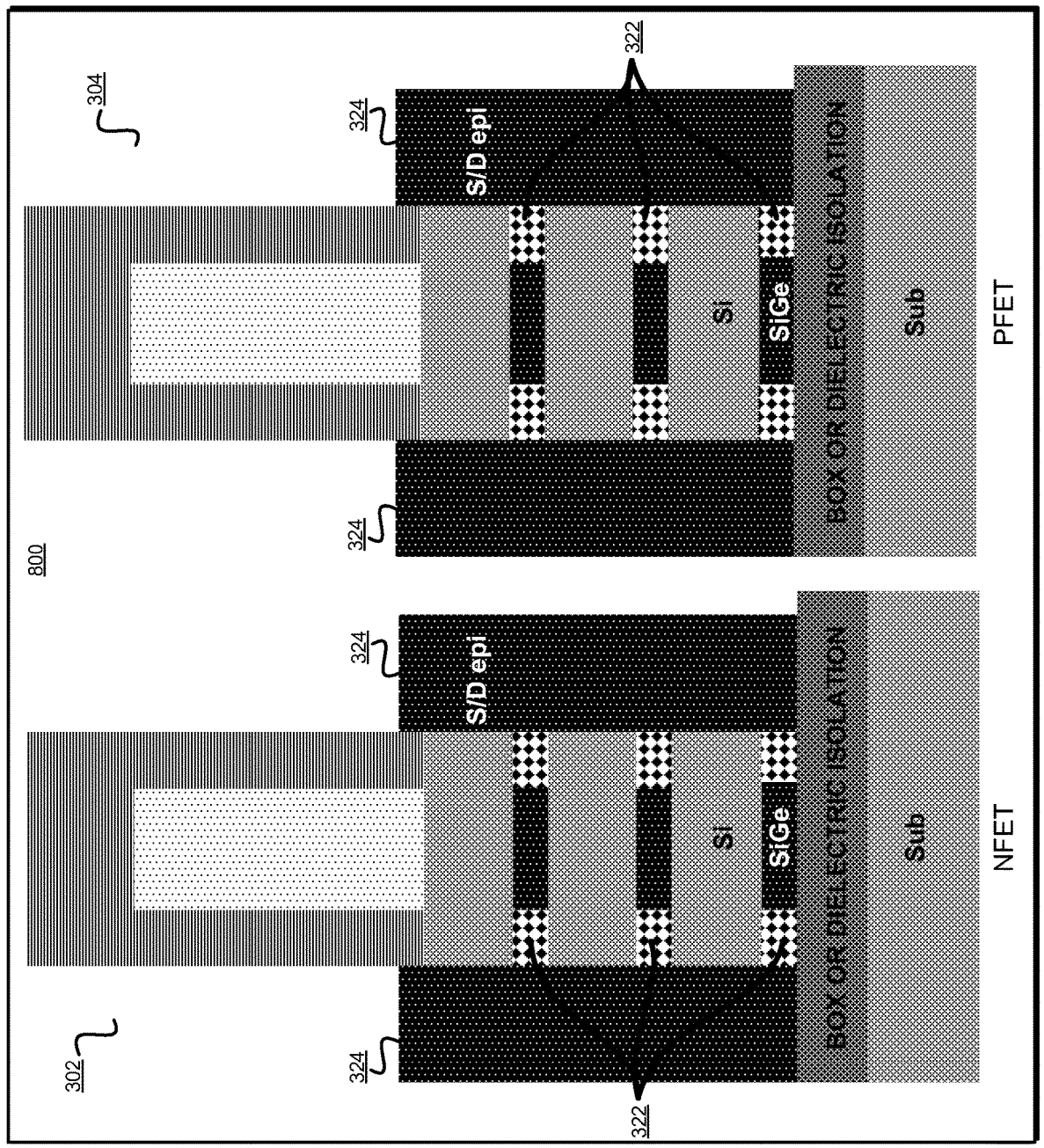
FIG. 8 depicts another portion of a process according to an illustrative embodiment.

With reference to FIG. 8, FIG. 8 depicts another portion of a process in which a structure 800 is formed according to an embodiment. In one or more embodiments, fabrication system 107 etches back first divot fill layer 320a and second divot fill layer 320b to form inner spacers 322 between Si layers 312a-312c of NFET region 302 and PFET region 304. In a particular embodiment, first divot fill layer 320a and second divot fill layer 320b are etched using an isotropic etching process. Fabrication system 107 further forms source/drain (S/D) regions 324 adjacent to each side of Si layers 312a-312c and divots 322 of each of NFET region 302 and PFET region 304. In particular embodiments, S/D regions 324 are formed using an epitaxial growth process.

Figure 9:
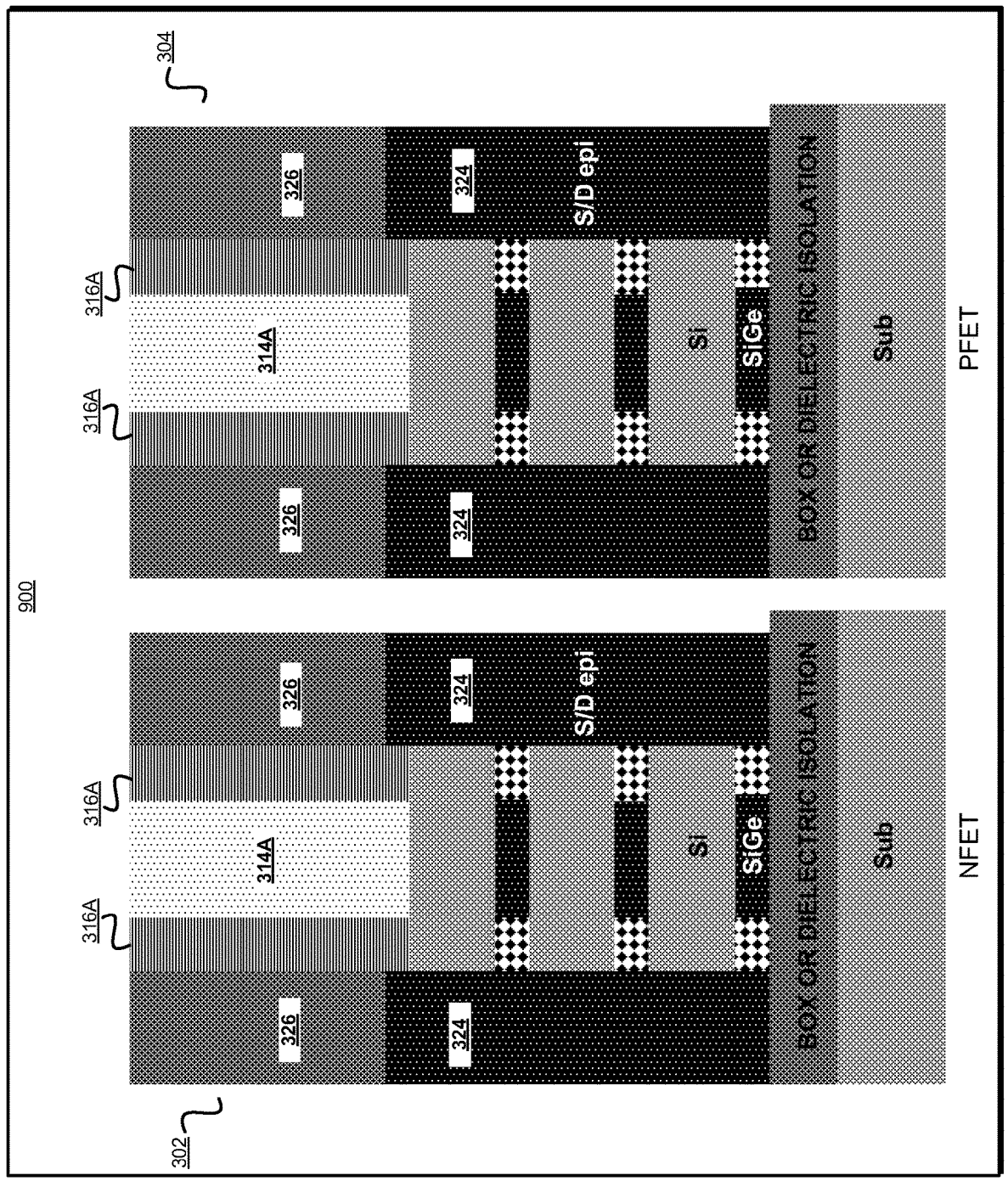
FIG. 9 depicts another portion of a process according to an illustrative embodiment.

With reference to FIG. 9, FIG. 9 depicts another portion of a process in which a structure 900 is formed according to an embodiment. In one or more embodiments, fabrication system 107 deposits a silicon oxide material 326 over S/D regions 324 of each of NFET region 302 and PFET regions 304. In the embodiment, fabrication system 107 removes a portion of first hard mask 316a to expose an upper surface of first dummy gate 314a of NFET region 302, and removes a portion of second hard mask 316b to expose an upper surface of second dummy gate 314b of PFET region 304.

Figure 10:
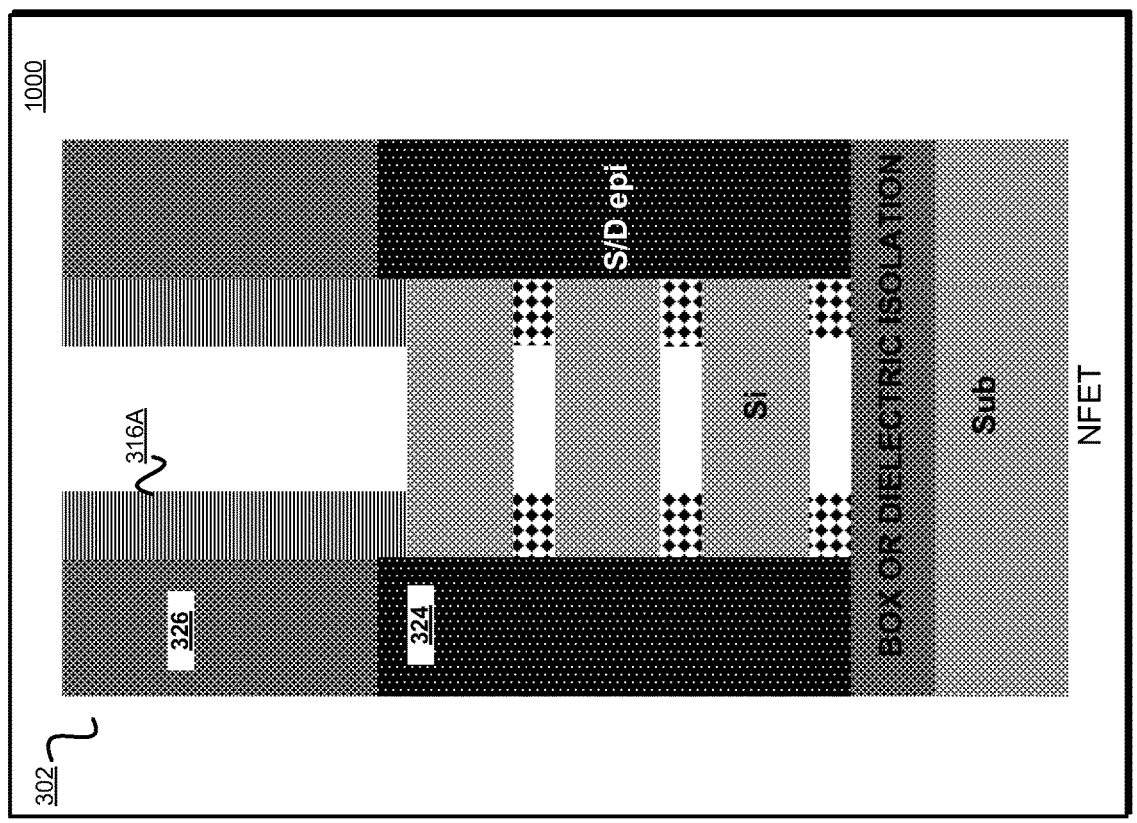
FIG. 10 depicts another portion of a process according to an illustrative embodiment.

With reference to FIG. 10, FIG. 10 depicts another portion of a process in which a structure 1000 is formed according to an embodiment. In the embodiment of FIG. 10, NFET region 302 remains exposed and PFET region 304 is blocked (or masked). For clarity of illustration, PFET region 304 is not shown. In one or more embodiments, fabrication system 107 removes the first dummy gate 314a from NFET region 302. In a particular embodiment, first dummy gate 314a is removed using an etching process such as a wet etching process using ammonia. In the embodiment, fabrication system 107 further selectively removes the remaining portions of SiGe layers 310a-310c of NFET region 302. In a particular embodiment, the remaining portions of SiGe layers 310a-310c are removed using an isotropic dry etching process.

Figure 11:
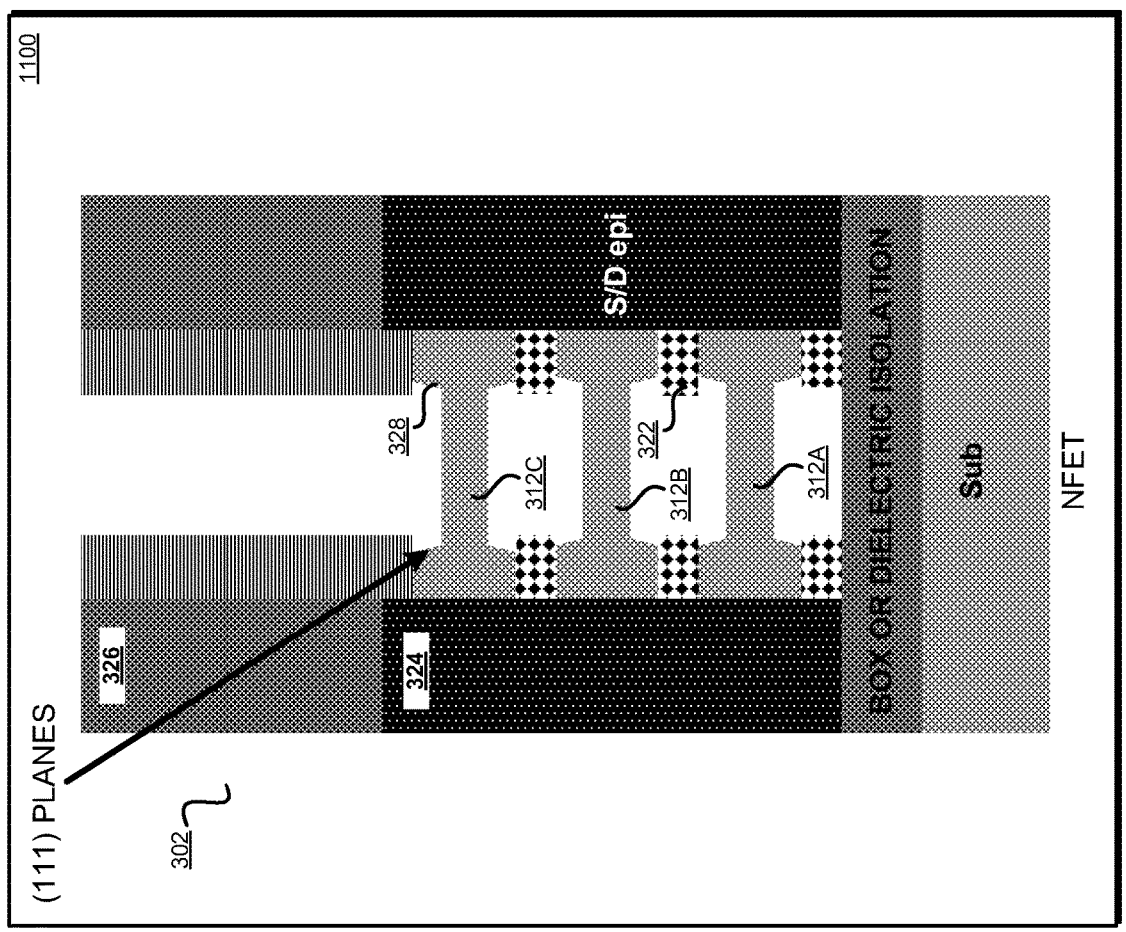
FIG. 11 depicts another portion of a process according to an illustrative embodiment.

With reference to FIG. 11, FIG. 11 depicts another portion of a process in which a structure 1100 is formed according to an embodiment. In one or more embodiments, fabrication system 107 etches each of Si layers 312a-312c of NFET region 302 to trim the nanosheet layers to the desired channel thickness and generate faceted surfaces 328 between Si layers 312a-312c and inner spacers 322. In a particular embodiment, faceted surfaces 328 include (1 1 1) plane silicon crystal lattice oriented surfaces. In a particular embodiment, a vapor phase HCl etch is used to etch Si layers 312a-312c and generate faceted surfaces 328.

Figure 12:
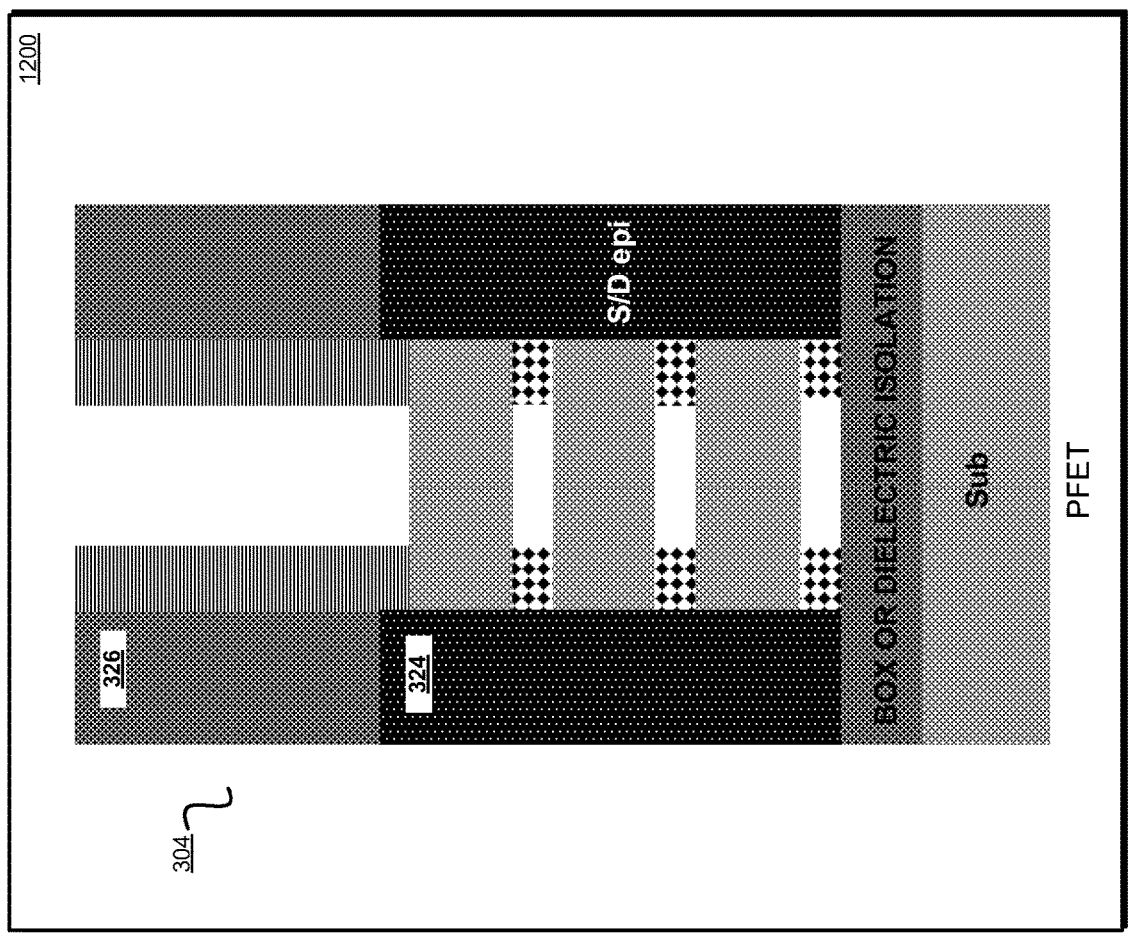
FIG. 12 depicts another portion of a process according to an illustrative embodiment.

With reference to FIG. 12, FIG. 12 depicts another portion of a process in which a structure 1200 is formed according to an embodiment. In the embodiment of FIG. 12, NFET region 302 is blocked (or masked) and PFET region 304 is exposed. For clarity of illustration, NFET region 302 is not shown. In one or more embodiments, fabrication system 107 removes the second dummy gate 314b from PFET region 302. In a particular embodiment, second dummy gate 314b is removed using an etching process such as a wet etching process using ammonia. In the embodiment, fabrication system 107 further selectively removes the remaining portions of SiGe layers 310a-310c of PFET region 304. In a particular embodiment, the remaining portions of SiGe layers 310a-310c are removed using an isotropic dry etching process.

Figure 13:
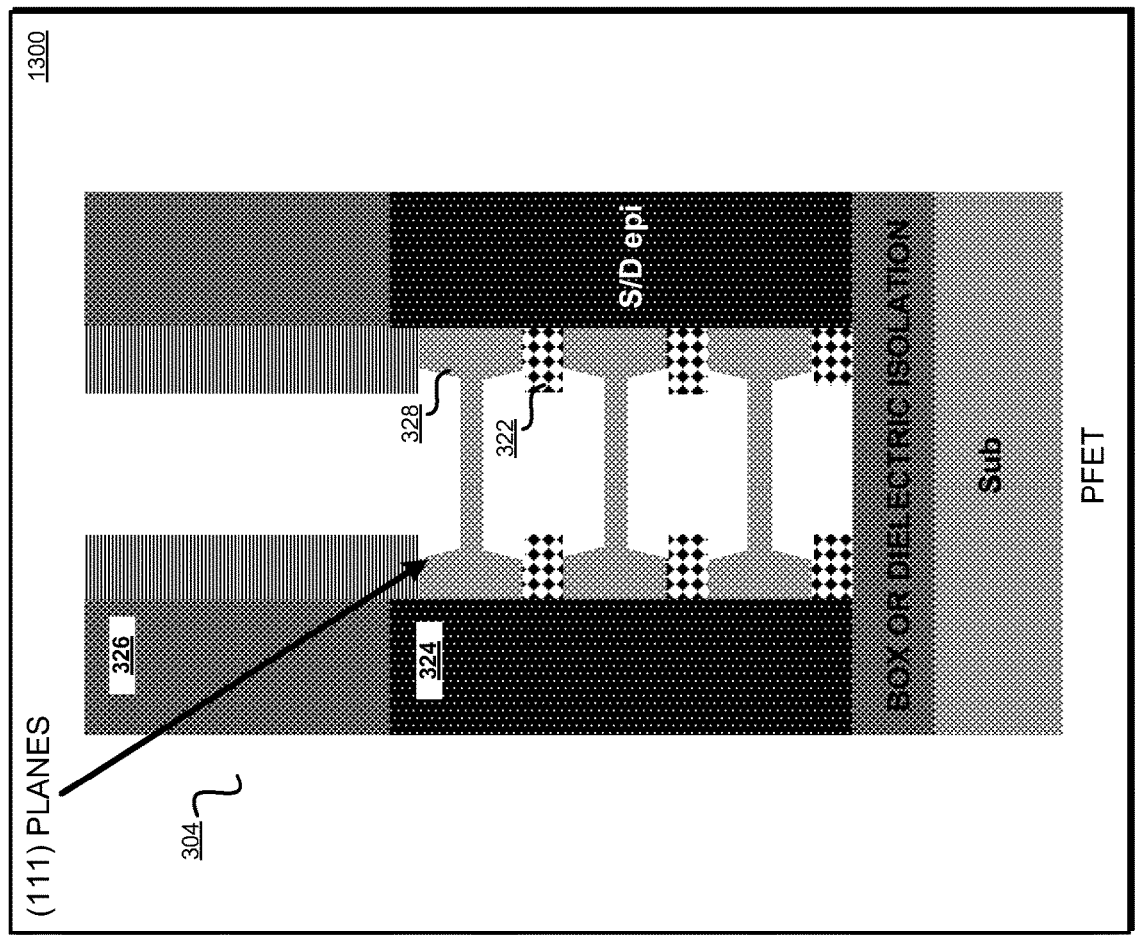
FIG. 13 depicts another portion of a process according to an illustrative embodiment.

With reference to FIG. 13, FIG. 13 depicts another portion of a process in which a structure 1300 is formed according to an embodiment. In one or more embodiments, fabrication system 107 etches each of Si layers 312a-312c of PFET region 304 to trim the nanosheet layers to the desired channel thickness and generate faceted surfaces 328 between Si layers 312a-312c and inner spacers 322. In a particular embodiment, faceted surfaces 328 include (1 1 1) plane silicon crystal lattice oriented surfaces. In a particular embodiment, a vapor phase HCl etch is used to etch Si layers 312a-312c and generate faceted surfaces 328.

Figure 14:
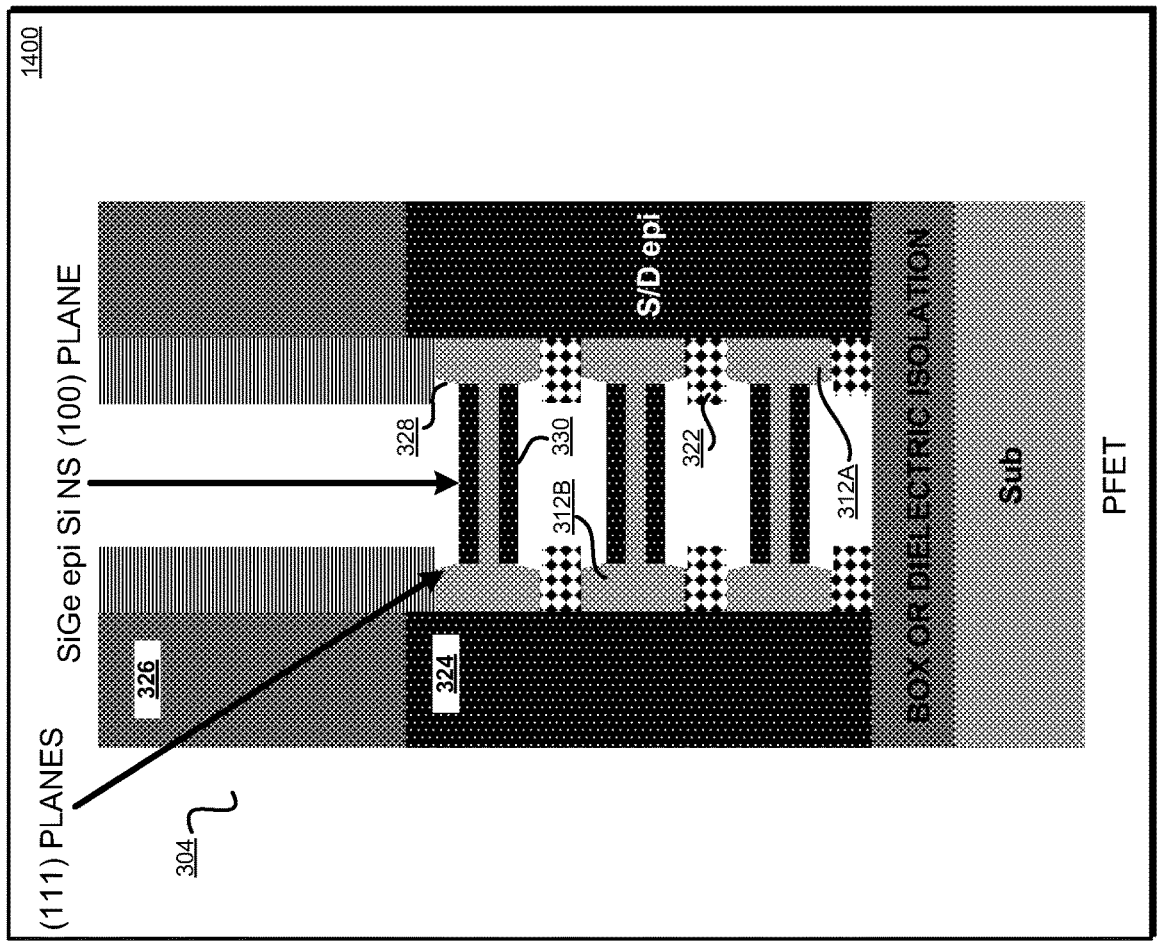
FIG. 14 depicts another portion of a process according to an illustrative embodiment.

With reference to FIG. 14, FIG. 14 depicts another portion of a process in which a structure 1400 is formed according to an embodiment. In one or more embodiments, fabrication system 107 forms SiGe cladding layers 330 upon an upper and lower surface of Si layers 312a-312c using an epitaxial growth process. In particular embodiments, faceted surfaces 328 are (1 1 1) plane silicon crystal lattice oriented surfaces in which the rate of SiGe epitaxy growth is much less than that of a (1 0 0) plane silicon surface of the upper and lower surfaces of Si layers 312a-312c. Accordingly, the epitaxial growth of SiGe cladding layers 330 is kept away from inner spacers 322.

Figure 15:
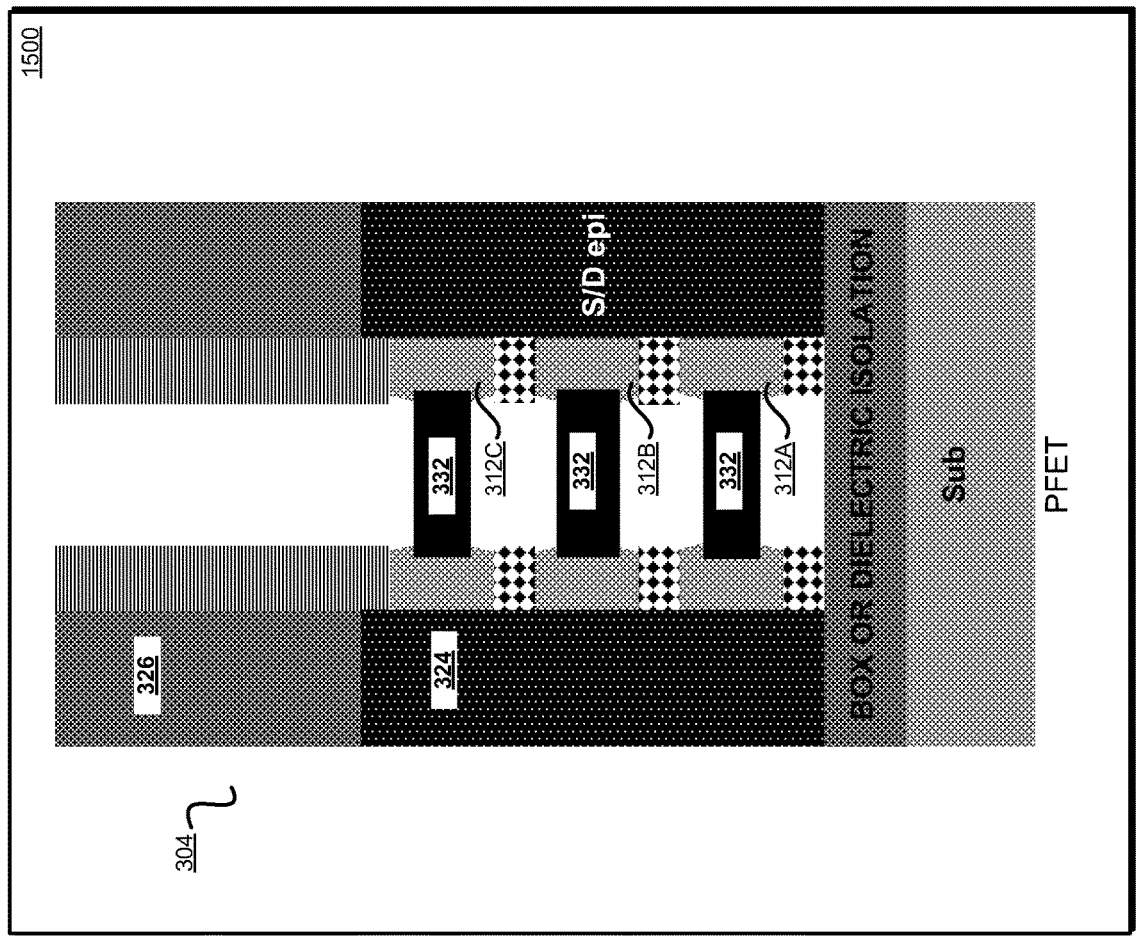
FIG. 15 depicts an optional portion of a process according to an illustrative embodiment.

With reference to FIG. 15, FIG. 15 depicts an optional portion of a process in which a structure 1500 is formed according to an embodiment. In one or more embodiments, fabrication system 107 optionally converts SiGe cladding layers 330 and a portion of Si layers 312a-312c of PFET region 304 into an SiGe material to form a SiGe channel for PFET region 304. In one or more embodiments, higher mobility and strain in the PFET channel may be achieved.

Figure 16:
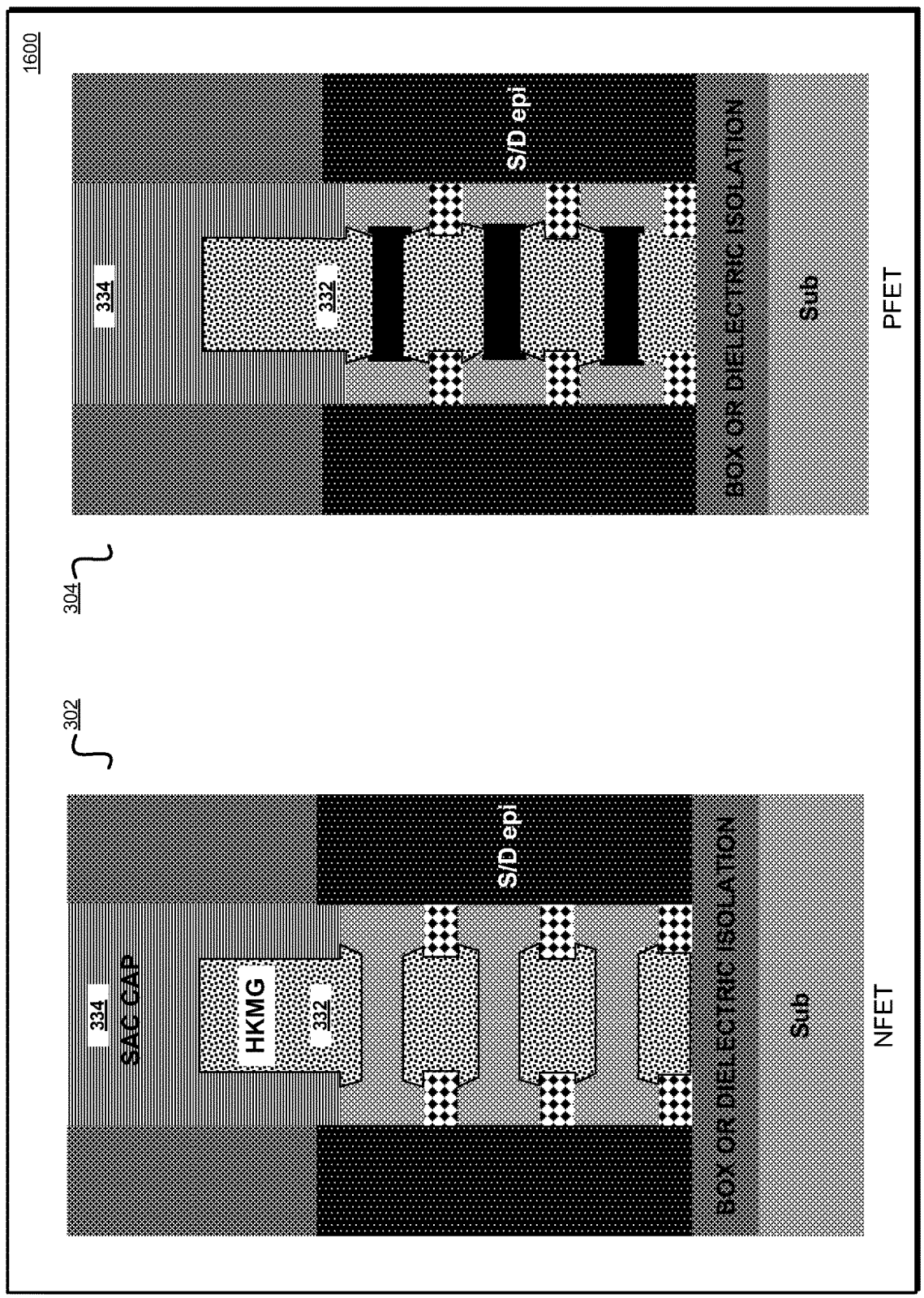
FIG. 16 depicts another portion of a process according to an illustrative embodiment.

With reference to FIG. 16, FIG. 16 depicts a portion of a process in which a structure 1600 is formed according to an embodiment. In the embodiment of FIG. 16, NFET region 302 and PFET region 304 are exposed. In one or more embodiments, fabrication system 107 deposits a high-K metallic gate (HKMG) material 332 or other work function metal (WFM) within each of NFET region 302 and PFET region 304 to form gates for NFET region 302 and PFET region 304, respectively. In one or more embodiments, fabrication system 107 further forms a self-aligned contact (SAC) cap 334 upon the HKMG material 332 of NFET region 302 and PFET region 304. In particular embodiments, fabrication system 107 further forms contacts to the S/D region and gates of each of NFET region 302 and PFET region 304. As a result an NFET is fabricated within NFET region 302 and a PFET is fabricated within PFET region 304.

Figure 17:
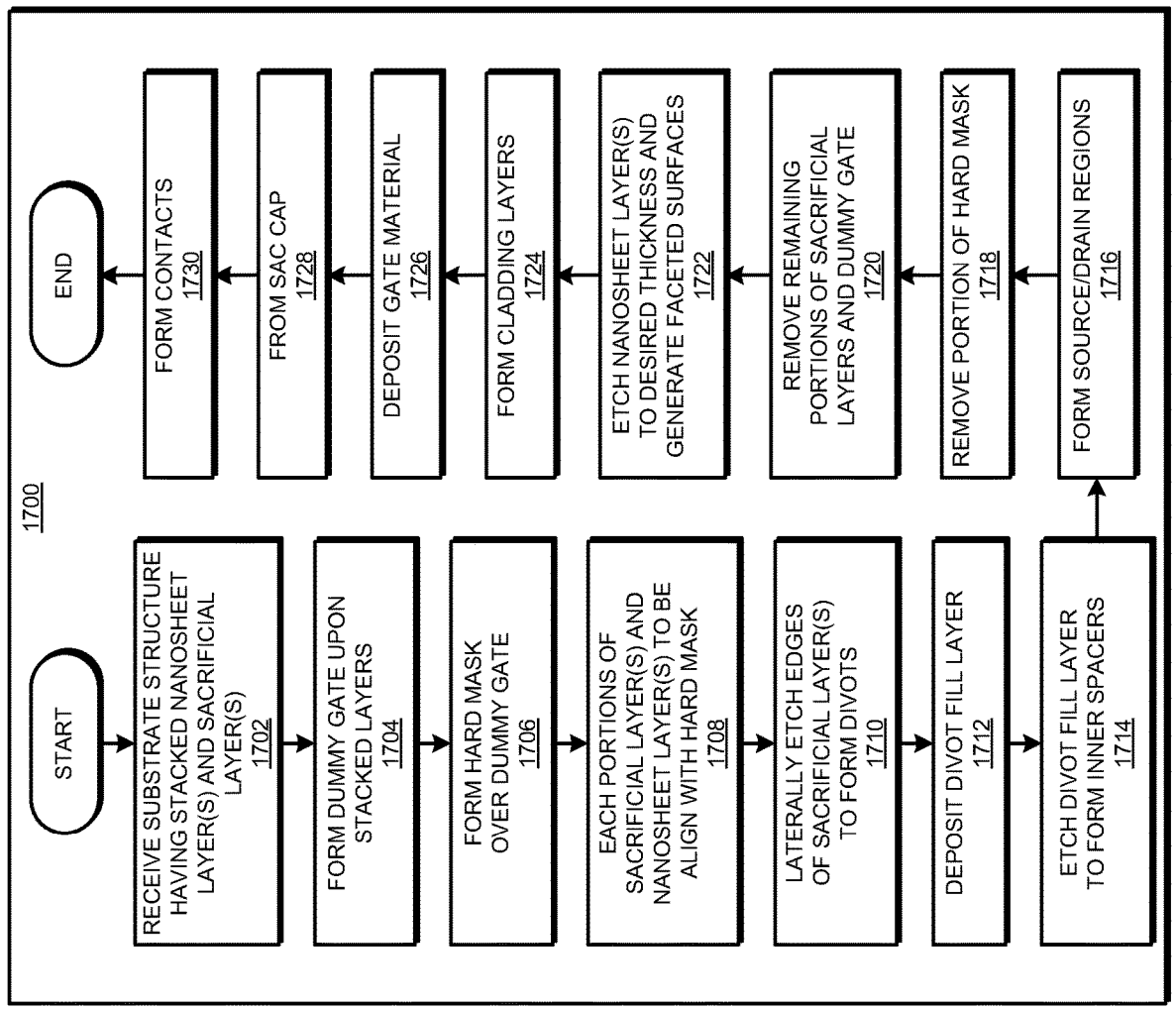
FIG. 17 depicts a flowchart of an example process for fabricating nanosheet transistors in accordance with an illustrative embodiment.

With reference to FIG. 17, FIG. 17 depicts a flowchart of an example process 1700 for fabricating nanosheet transistors in accordance with one or more illustrative embodiments. Process 1700 can be implemented in fabrication system 107 in FIG. 1, to perform one or more steps of FIGS. 3-16 as needed in process 1700.

In block 1702, fabrication system 107 receives a substrate structure having one or more nanosheet layers and one or more sacrificial layers stacked upon an isolation layer and a substrate. In a particular embodiment, the substrate structure includes substrate structure 300 having nanosheet layers formed of Si layers 312a-312c and sacrificial layers formed of SiGe layers 310a-310c.

In block 1704, fabrication system 107 forms a dummy gate upon the stacked nanosheet and sacrificial layers. In a particular embodiment, the dummy gate includes one or more of first dummy gate 314a and second dummy gate 314b. In one or more embodiments, the dummy gate functions as a spacer that is removed and replaced with metal material to form gates during subsequent portions of the fabrication process as further described herein. In block 1706, fabrication system 107 forms a hard mask, such as one or more of first hard mask 316a and second hard mask 316b over the dummy gate. The hard mask functions as a protective layer over the dummy gate.

In block 1708, fabrication system 107 etches through portions of the one or more sacrificial layers and one or more nanosheet layers to be substantially aligned to sides of the hard mask. In block 1710, fabrication system 107 selectively laterally etches edges (or other portions) of the one or more sacrificial layers to create divots (or indentations) within the one or more sacrificial layers. In one or more embodiments, the depth of the divots within the one or more sacrificial layers are substantially aligned with the sides of the dummy gate.

In block 1712, fabrication system 107 deposits a divot fill layer 320a upon the one or more sacrificial layers, the one or more nanosheet layers and the hard mask to fill the divots. In block 1714, fabrication system 107 etches the divot fill layer to form inner spacers between the one or more nanosheet layers. In block 1716, fabrication system 107 forms source/drain (S/D) regions adjacent to each side of the nanosheet layers and divots.

In block 1718, fabrication system 107 removes a portion of the hard mask to expose an upper surface of the dummy gate. In block 1720, fabrication system 107 removes the dummy gate and selectively removes the remaining portions of the one or more sacrificial layers. In block 1722, fabrication system 107 etches each of the one or more nanosheet layers to a desired channel thickness and generate faceted surfaces between the nanosheet layers and the inner spacers. In a particular embodiment, the faceted surfaces include (1 1 1) plane silicon crystal lattice oriented surfaces.

In block 1724, fabrication system 107 forms one or more cladding layers upon an upper and lower surface of the nanosheet layers. In particular embodiments, the faceted surfaces are (1 1 1) plane silicon crystal lattice oriented surfaces in which the rate of cladding material growth is much less than that of a (1 0 0) plane silicon surface of the upper and lower surfaces of the one or more nanosheet layers.

In block 1726, fabrication system 107 deposits a gate material, such as a high-K metallic gate (HKMG) material to form gates for the nanosheet transistor. In block 1728, fabrication system 107 further forms a self-aligned contact (SAC) cap upon the gate material. In block 1730, fabrication system 107 forms metal contacts to the S/D region and gates of the nanosheet transistor. As a result a nanosheet transistor is fabricated. The fabrication system 107 ends process 1700 thereafter.

Thus, a computer implemented method, system or apparatus, and computer program product are provided in the illustrative embodiments for fabricating nanosheet transistors in accordance with one or more illustrative embodiments and other related features, functions, or operations. Where an embodiment or a portion thereof is described with respect to a type of device, the computer implemented method, system or apparatus, the computer program product, or a portion thereof, are adapted or configured for use with a suitable and comparable manifestation of that type of device.

Where an embodiment is described as implemented in an application, the delivery of the application in a Software as a Service (SaaS) model is contemplated within the scope of the illustrative embodiments. In a SaaS model, the capability of the application implementing an embodiment is provided to a user by executing the application in a cloud infrastructure. The user can access the application using a variety of client devices through a thin client interface such as a web browser (e.g., web-based e-mail), or other light-weight client-applications. The user does not manage or control the underlying cloud infrastructure including the network, servers, operating systems, or the storage of the cloud infrastructure. In some cases, the user may not even manage or control the capabilities of the SaaS application. In some other cases, the SaaS implementation of the application may permit a possible exception of limited user-specific application configuration settings.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A method of fabricating a nanosheet device comprising:
    forming a stacked set of nanosheet layers and a set of sacrificial layers;
    etching a portion of a subset of a subset of the set of sacrificial layers to create divots within the subset of the subset of the set of sacrificial layers;
    depositing a divot fill layer upon the subset of the set of sacrificial layers and a subset of the stacked set of nanosheet layers to fill the divots;
    forming a cladding layer upon at least one surface of the subset of the set of nanosheet layers;
    etching the divot fill layer to form an inner spacer between the subset of the stacked set of nanosheet layers;
    removing a remaining portion of the subset of the set of sacrificial layers; and
    etching the subset of the stacked set of nanosheet layers to a desired channel thickness, thereby producing faceted surfaces between the subset of the stacked set of nanosheet layers and the inner spacer.

2. The method of claim 1, wherein the faceted surfaces are (1 1 1) plane silicon crystal lattice oriented surfaces in which a growth rate of cladding material is less than that of a (1 0

0) plane silicon surface of the at least one surface of the subset of the set of nanosheet layers.

3. The method of claim 1, further comprising:
forming a dummy gate upon the stacked set of nanosheet layers and the set of sacrificial layers; and
forming a hard mask over the dummy gate.

4. The method of claim 3, further comprising:
removing a portion of the hard mask to expose an upper surface of the dummy gate; and
removing the dummy gate.

5. The method of claim 3, wherein the subset of the set of sacrificial layers and the subset of the set of nanosheet layers are etched to be substantially aligned to one or more sides of the hard mask.

6. The method of claim 1, wherein the set of nanosheet layers and the set of sacrificial layers are stacked upon an isolation layer, and wherein the isolation layer is disposed upon a substrate.

7. The method of claim 1, further comprising:
forming a source/drain (S/D) region adjacent to the subset of the stacked set of nanosheet layers and the divots; and
depositing a gate material.

8. The method of claim 7, further comprising:
forming a self-aligned contact (SAC) cap upon the gate material.

9. The method of claim 7, further comprising:
forming metal contacts to the S/D region and the gate material.

10. The method of claim 1, wherein the set of nano sheet layers are formed of silicon (Si) material.

11. The method of claim 1, wherein the set of sacrificial layers are formed of a silicon-germanium (SiGe) material.

12. The method of claim 1, wherein the divot fill layer is formed of a silicon nitride (SiN) material.

* * * * *